(12) United States Patent
Marzaki et al.

(10) Patent No.: US 10,818,669 B2
(45) Date of Patent: Oct. 27, 2020

(54) INTEGRATED CIRCUIT WITH VERTICALLY STRUCTURED CAPACITIVE ELEMENT, AND ITS FABRICATING PROCESS

(71) Applicants: STMicroelectronics (Rousset) SAS, Rousset (FR); STMicroelectronics (Crolles 2) SAS, Crolles (FR)

(72) Inventors: Abderrezak Marzaki, Aix en Provence (FR); Arnaud Regnier, Les Taillades (FR); Stephan Niel, Meylan (FR); Quentin Hubert, Marseilles (FR); Thomas Cabout, Grenoble (FR)

(73) Assignees: STMicroelectronics (Rousset) SAS, Rousset (FR); STMicroelectronics (Crolles 2) SAS, Crolles (FR)

(*) Notice: Subject to any disclaimer, the term of this patent is extended or adjusted under 35 U.S.C. 154(b) by 0 days.

(21) Appl. No.: 16/111,480

(22) Filed: Aug. 24, 2018

(65) Prior Publication Data
US 2019/0067291 A1 Feb. 28, 2019

(30) Foreign Application Priority Data
Aug. 28, 2017 (FR) .................................. 17 57907

(51) Int. Cl.
*H01L 27/108* (2006.01)
*H01L 29/66* (2006.01)
(Continued)

(52) U.S. Cl.
CPC .... *H01L 27/10841* (2013.01); *H01L 27/1087* (2013.01); *H01L 27/10864* (2013.01);
(Continued)

(58) Field of Classification Search
CPC . H01L 29/945; H01L 28/60; H01L 29/66181; H01L 27/1087; H01L 27/10894; H01L 28/82; H01L 28/91
See application file for complete search history.

(56) References Cited

U.S. PATENT DOCUMENTS 5,581,110 A * 12/1996 Razouk ............... H01L 21/3105
257/513
5,805,494 A 9/1998 El-Kareh et al.
(Continued)

FOREIGN PATENT DOCUMENTS

EP 1335425 A1 8/2003
FR 2894708 A1 6/2007
(Continued)

OTHER PUBLICATIONS

INPI Search Report and Written Opinion for FR 1757907 dated May 7, 2018 (12 pages).
(Continued)

*Primary Examiner* — Bilkis Jahan
*Assistant Examiner* — Victor V Barzykin
(74) *Attorney, Agent, or Firm* — Crowe & Dunlevy

(57) ABSTRACT

A capacitive element includes a trench extending vertically into a well from a first side. The trench is filled with a conductive central section clad with an insulating cladding. The capacitive element further includes a first conductive layer covering a first insulating layer that is located on the first side and a second conductive layer covering a second insulating layer that is located on the first conductive layer. The conductive central section and the first conductive layer are electrically connected to form a first electrode of the capacitive element. The second conductive layer and the well are electrically connected to form a second electrode of the capacitive element. The insulating cladding, the first
(Continued)

insulating layer and the second insulating layer form a dielectric region of the capacitive element.

27 Claims, 6 Drawing Sheets

(51) Int. Cl.
    H01L 49/02       (2006.01)
    H01L 29/94       (2006.01)
(52) U.S. Cl.
    CPC .. *H01L 27/10867* (2013.01); *H01L 27/10876* (2013.01); *H01L 28/60* (2013.01); *H01L 29/66181* (2013.01); *H01L 29/945* (2013.01)

(56) References Cited

U.S. PATENT DOCUMENTS

| | | | |
|---|---|---|---|
| 6,391,707 B1 * | 5/2002 | Dirnecker | H01L 23/5223 |
| | | | 257/532 |
| 7,449,744 B1 | 11/2008 | Yu et al. | |
| 8,085,524 B2 * | 12/2011 | Roozeboom | H01L 27/0805 |
| | | | 361/301.2 |
| 8,492,820 B2 | 7/2013 | Anderson et al. | |
| 8,525,245 B2 | 9/2013 | Erickson et al. | |
| 8,816,470 B2 | 8/2014 | Erickson et al. | |
| 9,159,723 B2 * | 10/2015 | Chou | H01L 29/945 |
| 9,178,080 B2 * | 11/2015 | Kalnitsky | H01L 28/91 |
| 9,349,793 B2 | 5/2016 | Jaffe et al. | |
| 9,978,829 B2 * | 5/2018 | Lin | H01L 29/945 |
| 10,049,890 B2 * | 8/2018 | Chou | H01L 21/32053 |
| 10,084,035 B2 * | 9/2018 | Papavasiliou | H01L 27/14643 |
| 10,109,601 B2 | 10/2018 | Marzaki | |
| 2007/0054461 A1 | 3/2007 | Su | |
| 2007/0278612 A1 | 12/2007 | Williams et al. | |
| 2009/0039466 A1 | 2/2009 | Sanada | |
| 2011/0018094 A1 | 1/2011 | Chapman et al. | |
| 2012/0032260 A1 | 2/2012 | Hirler et al. | |
| 2013/0069198 A1 * | 3/2013 | Claeys | H01L 27/016 |
| | | | 257/532 |
| 2013/0161792 A1 * | 6/2013 | Tran | H01L 29/92 |
| | | | 257/534 |
| 2014/0145299 A1 * | 5/2014 | Kalnitsky | H01L 29/945 |
| | | | 257/532 |
| 2014/0264523 A1 | 9/2014 | Loechelt et al. | |
| 2015/0061075 A1 | 3/2015 | Yeh | |
| 2015/0236031 A1 * | 8/2015 | Mantelli | H01L 27/11524 |
| | | | 365/185.28 |
| 2016/0020267 A1 * | 1/2016 | Lin | H01L 28/91 |
| | | | 257/532 |
| 2016/0218071 A1 * | 7/2016 | Nam | H01L 28/91 |

FOREIGN PATENT DOCUMENTS

| | | |
|---|---|---|
| FR | 3013148 A1 | 5/2015 |
| FR | 3021457 A1 | 11/2015 |

OTHER PUBLICATIONS

La Rosa, F., et al.: "40nm Embedded Select in Trench Memory (eSTM) Technology Overview," 2019 IEEE 11th International Memory Workshop, 4 pages.

* cited by examiner

INTEGRATED CIRCUIT WITH VERTICALLY STRUCTURED CAPACITIVE ELEMENT, AND ITS FABRICATING PROCESS

PRIORITY CLAIM

This application claims the priority benefit of French Application for Patent No. 1757907, filed on Aug. 28, 2017, the content of which is hereby incorporated by reference in its entirety to the maximum extent allowable by law.

TECHNICAL FIELD

Embodiments and implementations of the invention relate to integrated circuits and in particular to capacitive elements operating in accumulation mode or inversion mode.

BACKGROUND

Capacitive elements, such as charge-storage capacitors, are generally bulky components in integrated-circuit architectures.

Moreover, integrated-circuit component fabricating process steps are generally many in number and expensive, and it is constraining to implement steps dedicated solely to the fabrication of a single element or of a single type of element.

Thus, it would be desirable to increase the capacitance per unit area of integrated-circuit capacitive-element architectures, and to implement their fabricating steps conjointly with the production of other components of the integrated circuit.

SUMMARY

In this context, according to one aspect, an integrated circuit is provided comprising a semiconductor substrate containing at least one semiconductor well that is doped a first conductivity type, a capacitive element comprising at least one trench including a conductive central section clad with an insulating cladding and extending vertically into said well from a first side, a first conductive layer covering a first insulating layer that is located on the first side and a second conductive layer covering a second insulating layer that is located on the first conductive layer, the conductive central section and the first conductive layer being electrically coupled or connected and thus forming a first electrode of the capacitive element, the second conductive layer and the well being electrically coupled or connected and thus forming a second electrode of the capacitive element, the insulating cladding, the first insulating layer and the second insulating layer forming a dielectric region of the capacitive element.

Thus, said at least one trench allows the area of the first electrode to be maximized in the depth of the well and therefore the capacitance per unit area of the capacitive element to be increased.

According to one embodiment, an auxiliary semiconductor layer is configured to form a source of minority carriers in the well.

The auxiliary semiconductor layer is advantageously doped a second conductivity type opposite the first conductivity type and is intended to receive a biasing voltage.

The auxiliary layer, since it is doped the conductivity type opposite that of the well, forms a source of minority carriers allowing the capacitive element to be used both in accumulation mode and in inversion mode (i.e., both with a positive voltage and with a negative voltage between its electrodes).

For example, the auxiliary semiconductor layer includes a buried layer under the well and under said at least one trench, and contact segments extending from the first side to the buried layer.

The auxiliary semiconductor layer may include an auxiliary contact region level with the first side and electrically coupled or connected to the second electrode Said at least one trench furthermore may include an implanted region of the second conductivity type located between the bottom of said central section clad with said cladding and the buried layer.

For example, the auxiliary semiconductor layer is located level with the first side in the well.

The auxiliary semiconductor layer may include an auxiliary contact region extending from the first side and electrically coupled or connected to the second electrode.

According to one embodiment, the integrated circuit includes a memory device including a memory plane possessing non-volatile memory cells that are equipped with access transistors, each with a vertical gate, and floating-gate transistors, said at least one trench having a depth substantially equal to that of said vertical gates.

According to one embodiment in which each vertical gate includes a gate material clad with a gate oxide, the material of said conductive central section is of the same nature as said gate material and the material of said insulating cladding is of the same nature as said gate oxide.

According to one embodiment in which said floating-gate transistors include a double-gate structure comprising a tunnel oxide, a conductive floating gate, a control-gate dielectric and a conductive control gate, the first insulating layer, the first conductive layer, the second insulating layer and the second conductive layer form a structure the materials and arrangement of which are of the same natures as the materials and arrangement of said double-gate structure.

According to another aspect a process is provided for fabricating a capacitive element, comprising, in a well doped a first conductivity type formed beforehand in a semiconductor substrate: forming at least one trench extending vertically into said well from a first side of the well; forming an insulating cladding on the flanks and bottom of said at least one trench; forming a conductive material in a central section clad with the insulating cladding; forming a first insulating layer on the first side and a first conductive layer covering the first insulating layer; forming a second insulating layer on the first conductive layer and a second conductive layer covering the second insulating layer; creating a first electrical connection or first electrical coupling between the conductive central section and the first conductive layer, forming a first electrode of a capacitive element; and creating a second electrical connection or second electrical coupling between the second conductive layer and the well, forming a second electrode of the capacitive element.

According to one implementation, the process comprises fabricating, in and on the semiconductor substrate, nonvolatile memory cells belonging to a memory plane and equipped with access transistors with vertical gates and floating-gate transistors, and: wherein said formation of at least one trench, said formation of an insulating cladding and said formation of a conductive material are carried out conjointly with steps of forming the access transistors; and said formation of a first insulating layer on the first side and of a first conductive layer covering the first insulating layer, and wherein said formation of a second insulating layer on the first conductive layer and of a second conductive layer covering the second insulating layer are carried out conjointly with steps of fabricating the floating-gate transistors.

For example, the fabrication of the capacitive element comprises forming an auxiliary semiconductor layer that is doped a second conductivity type opposite the first conductivity type, conjointly with a step of fabricating a buried source-region layer of the access transistors and electrical coupling or connection of the auxiliary layer to said second electrode.

For example, the fabrication of the capacitive element comprises forming an auxiliary semiconductor layer that is doped a second conductivity type opposite the first conductivity type, conjointly with a step of forming a counter-implant region of the floating-gate transistors, and electrical coupling or connection of the auxiliary layer to said second electrode.

BRIEF DESCRIPTION OF THE DRAWINGS

Other advantages and features of the invention will become apparent on examining the detailed description of completely non-limiting embodiments and implementations, and the appended drawings, in which.

DETAILED DESCRIPTION

Figure 1:
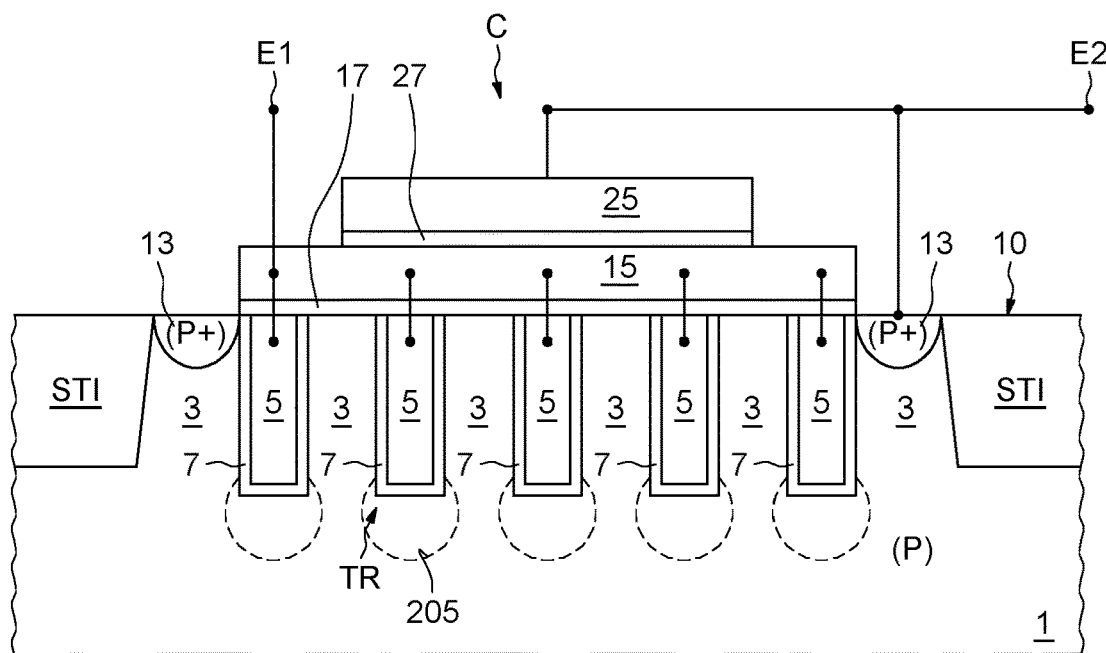
FIG. 1 schematically illustrates one embodiment of a capacitive element.

FIG. 1 shows one example embodiment of a capacitive element C.

The capacitive element C is formed in and on a semiconductor substrate 1 doped with a first conductivity type.

The substrate 1 includes a single well 3 (in contrast for example to a "triple well") in which trenches TR are formed. The well 3 is bounded laterally, as is conventional, by trench isolations STI that here are shallow trench isolations.

The trenches TR extend into the well 3 from a first side 10 of the substrate 1, which side is usually called the "front side".

As will be seen below with reference to FIGS. 4 and 8, for reasons of fabricating-process optimization, each trench TR may include an implanted region 205 doped with a second conductivity type opposite the first conductivity type located in the well 3, under the respective bottoms of each of said trenches TR.

A trench includes a central section 5 filled with a conductive material and clad with an insulating cladding 7 separating the central section 5 from the well 3.

For example, the central section 5 is made of doped polycrystalline silicon, also called polysilicon, and the insulating cladding 7 is made of silicon dioxide or another dielectric material.

On the first side 10, and above the well 3, is formed a stack of a first insulating layer 17, a first conductive layer 15, a second insulating layer 27 and a second conductive layer 25.

The first conductive layer 15 and the second conductive layer 25 are, for example, formed from doped polysilicon, the first insulating layer 17 is formed from a dielectric material such as silicon dioxide and the second insulating layer is formed from a silicon oxide-nitride-oxide (ONO) dielectric material type structure.

As explained below, in particular with reference to FIG. 5, this structure is advantageously similar to a structure of a non-volatile memory cell. Specifically, a memory cell may include an access transistor having a vertical gate with a structure homologous to the trenches TR, and a floating-gate transistor with a structure homologous to the stack of the first and second insulating layers 17, 27 and of the first and second conductive layers 15, 25.

A first electrode E1 of a capacitive element C is formed by electrically coupling or connecting the conductive materials of the central section 5 of each trench TR to the first conductive layer 15.

Vias and metal connection tracks may allow the conductive materials of the central section 5 of the trenches TR to be connected to the first conductive layer 15.

A second electrode E2 of the capacitive element C is formed by electrically coupling or connecting the second conductive layer 25 to the doped semiconductor well 3.

Contact-redistribution regions 13 that are highly doped with the first conductivity type allow a contact of acceptable resistivity to be formed between the well 3 and, for example, metal connection tracks connected to the second conductive layer 25.

In this example, the contact redistributions 13 are located laterally on either side of the trenches TR.

Figure 2:
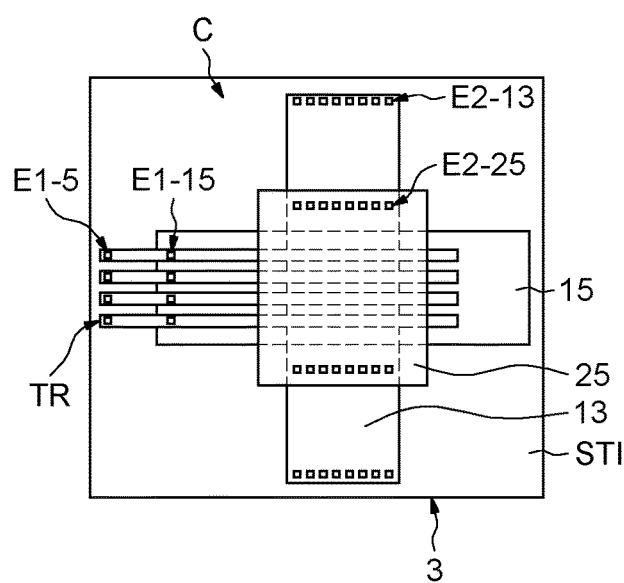
FIG. 2 shows a top view of the capacitive element.

FIG. 2 shows a top view of the example described with reference to FIG. 1; common elements have been referenced with the same references and will not be described in detail again below.

The trenches TR extend longitudinally (i.e., in a direction perpendicular to the cross-sectional plane shown in FIG. 1) further than the first insulating layer (17) covered by the first conductive layer 15, thus allowing electrical contacts E1-5 to be formed with the central section (5) of each trench TR. Likewise, the first conductive layer 15 extends, in this example, longitudinally further than the stack of the second insulating layer (27) and the second conductive layer 25 allowing contacts E1-15 to be formed with the first conductive layer.

The contacts E1-5 of the central sections 5 and the contacts E1-15 of the first conductive layer 15 are electrically coupled or connected, for example by means of metal tracks (not shown in this figure), thus forming the first electrode (E1) of the capacitive element C.

Moreover, electrical contacts E2-13 are produced on the contact-redistribution regions 13 formed in the well 3 and electrical contacts E2-25 are produced on the second conductive layer 25.

The contacts E2-13 of the substrate 1 and the contacts E2-25 of the second conductive layer 25 are electrically coupled or connected, for example by means of metal tracks (not shown in this figure), thus forming the second electrode (E2) of the capacitive element C.

Figure 3:
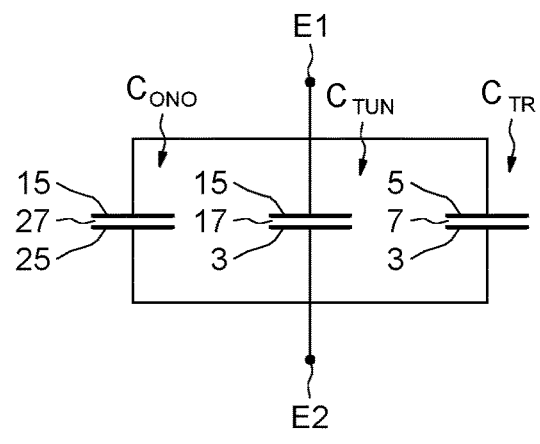
FIG. 3 is equivalent circuit diagram.

FIG. 3 shows the equivalent circuit diagram of the examples described above and also applies to the examples of the other embodiments described below.

The capacitive element C may be decomposed into an assembly of three capacitive elements $C_{ONO}$, $C_{TUN}$ and $C_{TR}$ in parallel.

A first capacitive element $C_{ONO}$ is formed by the first conductive layer 15 and the second conductive layer 25 mutually separated by the second insulating layer 27.

A second capacitive element $C_{TUN}$ is formed by the first conductive layer 15 and the well 3 mutually separated by the first insulating layer 17.

A third capacitive element C is formed by the central sections 5 of the trenches TR and the well 3 mutually separated by the respective insulating claddings 7 of the trenches TR.

In the example in which the first conductivity type is p-type and the second conductivity type is n-type, the capacitive element C operates in accumulation mode, i.e. when the voltage $V_C$ between the first electrode E1 and the second electrode E2, $V_C=V_{E2}-V_{E1}$ is positive, because of the p-type conductivity of the carriers of the well 3.

Although capacitive elements in integrated circuits are generally intended to operate exclusively in accumulation mode, it may be advantageous for a capacitive element to be capable of also operating in inversion mode.

FIGS. 4 to 7 show examples of embodiments of capacitive elements C able to advantageously operate both in accumulation mode and in inversion mode.

In these embodiments, an auxiliary semiconductor layer is configured to form a source of minority carriers in the well.

In brief, the source of minority carriers allows the capacitive element to be used in an inversion regime.

Figure 4:
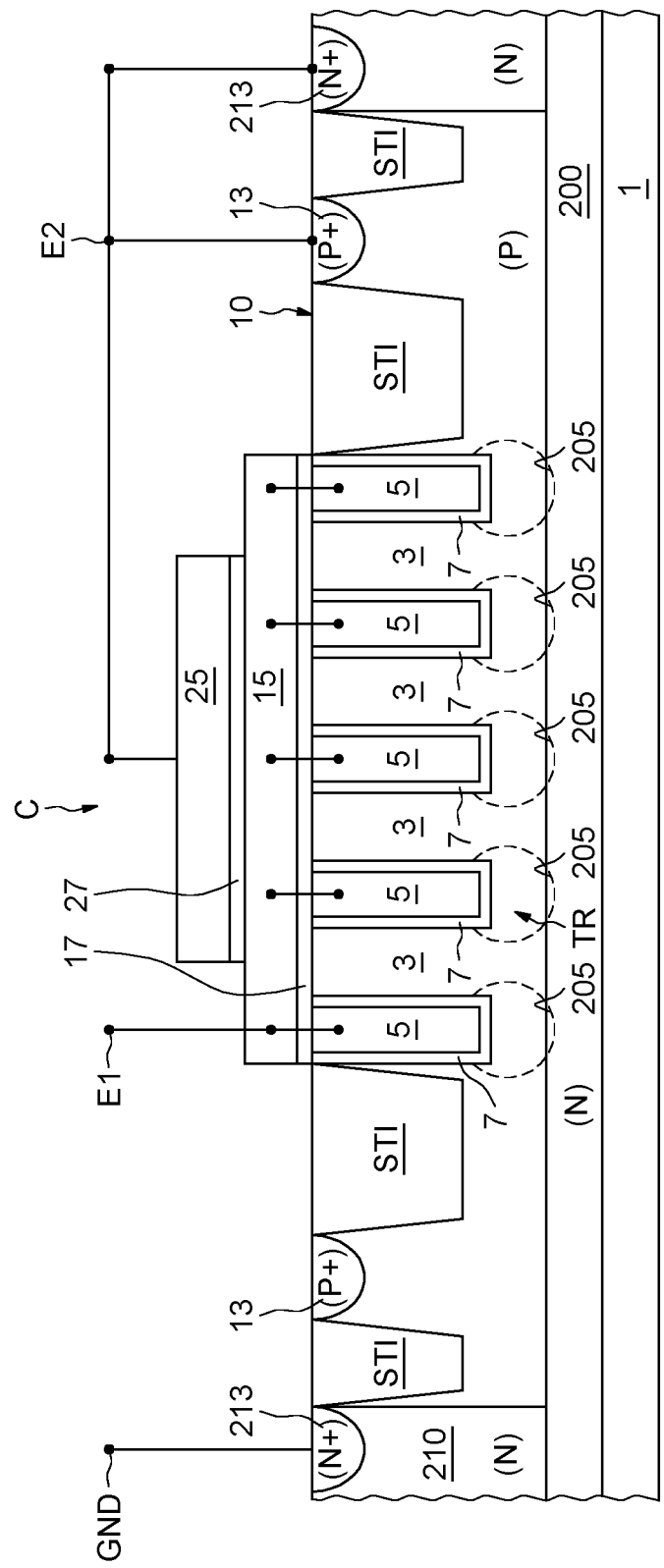
FIGS. 4 to 7 show examples of embodiments of capacitive elements.

FIG. 4 shows one example embodiment of the capacitive element C able to operate in inversion mode, in which figure structural elements in common with the examples described above with reference to FIGS. 1 to 3 have been given the same references and are not described in detail again below.

In this example, the well 3 forms part of a triple-well architecture and is electrically isolated from the substrate 1 by an isolating layer doped with a second conductivity type opposite the first conductivity type of the well 3 and of the substrate.

The isolating layer includes a buried layer 200 doped with the second conductivity type under the well 3 and contact segments 210 doped with the second conductivity type extending from the front side 10 to the buried layer 200.

Auxiliary contact regions 213 that are highly doped with the second conductivity type are formed level with the front side 10 in the contact segments 210.

Said auxiliary contact regions 213 allow a contact of acceptable resistivity between a terminal intended to receive a biasing voltage, for example a ground terminal GND, and the contact segments 210 and the buried layer 200.

The contact segments 210 and the auxiliary contact regions 213 form a ring and encircle the well 3 laterally and longitudinally.

The isolating layer 200, 210, 213 thus forms the auxiliary semiconductor layer configured to form a source of minority carriers in the well 3, allowing the capacitive element C to operate in inversion mode.

The contact-redistribution regions 13 and auxiliary contact-redistribution regions 213 are both electrically connected to the second electrode E2.

Moreover, the trenches TR may include an implanted region 205 doped with the second conductivity type, which region is located between the respective bottoms of the trenches TR and the buried layer 200, allowing electrical continuity to be ensured between the edges of the trenches TR and the buried semiconductor layer 200.

The contact-redistribution regions 13 that are highly doped the first conductivity type and implanted in the well 3 level with the first side 10 also form a ring on the surface of the well 3, in the interior of the ring formed by the contact segments 210 and the segment-contact regions 213.

Thus, this example of a capacitive element C operates in accumulation mode similarly to the example described with reference to FIG. 1, and operates in inversion mode via the formation of a minority-carrier region in the well 3, in the vicinity of the edges of said trenches TR and in the vicinity of the first side under said insulating layer 17.

Figure 5:
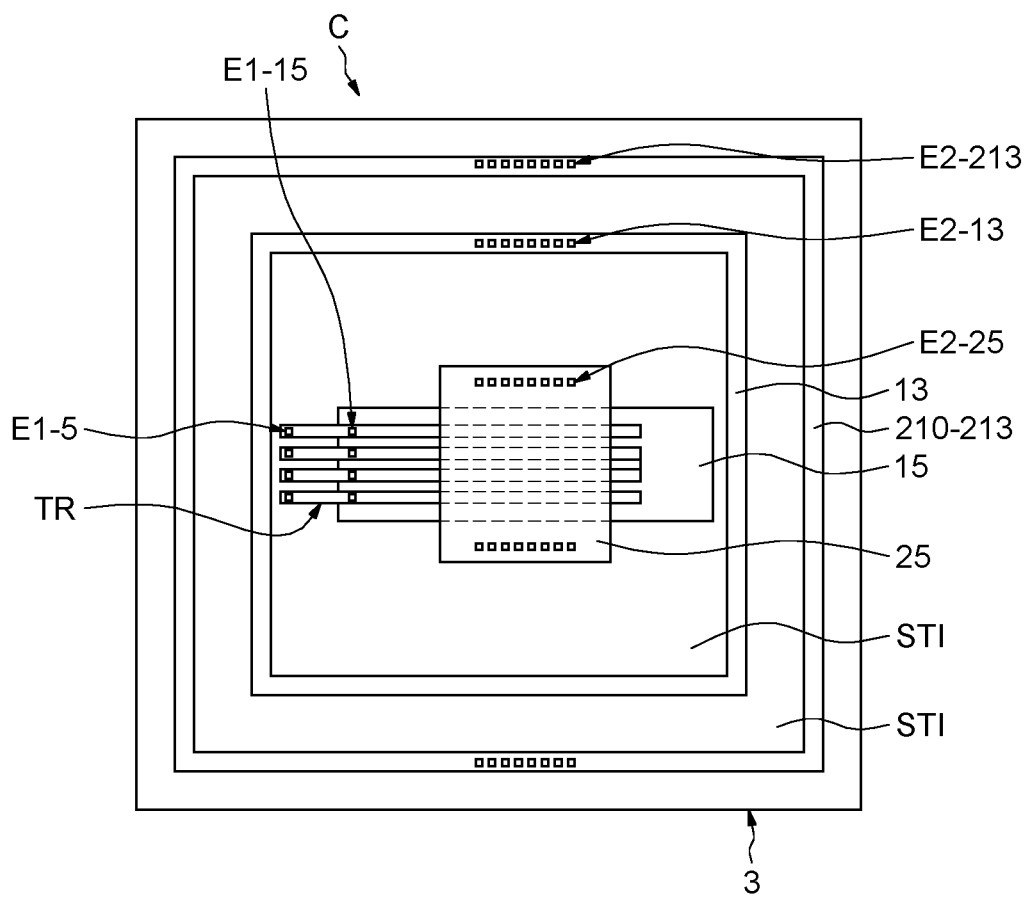

FIG. 5 shows a top view of the example described with reference to FIG. 4; common elements have been given the same references and are not all described in detail again below.

The contacts E1-5 of the central sections 5 and the contacts E1-15 of the first conductive layer 15 are electrically coupled or connected, for example by means of metal tracks (which are not shown in this figure), thus forming the first electrode (E1) of the capacitive element C.

In this example, electrical contacts E2-213 are furthermore formed with the auxiliary contact region 213.

An electrical coupling or connection formed between the contacts E2-13 of the well 3, the contacts E2-213 of the auxiliary contact region 213 and the contacts E2-25 of the second conductive layer 25, for example by means of metal tracks (not shown in this figure), thus forms the second electrode (E2) of the capacitive element C.

Figure 6:
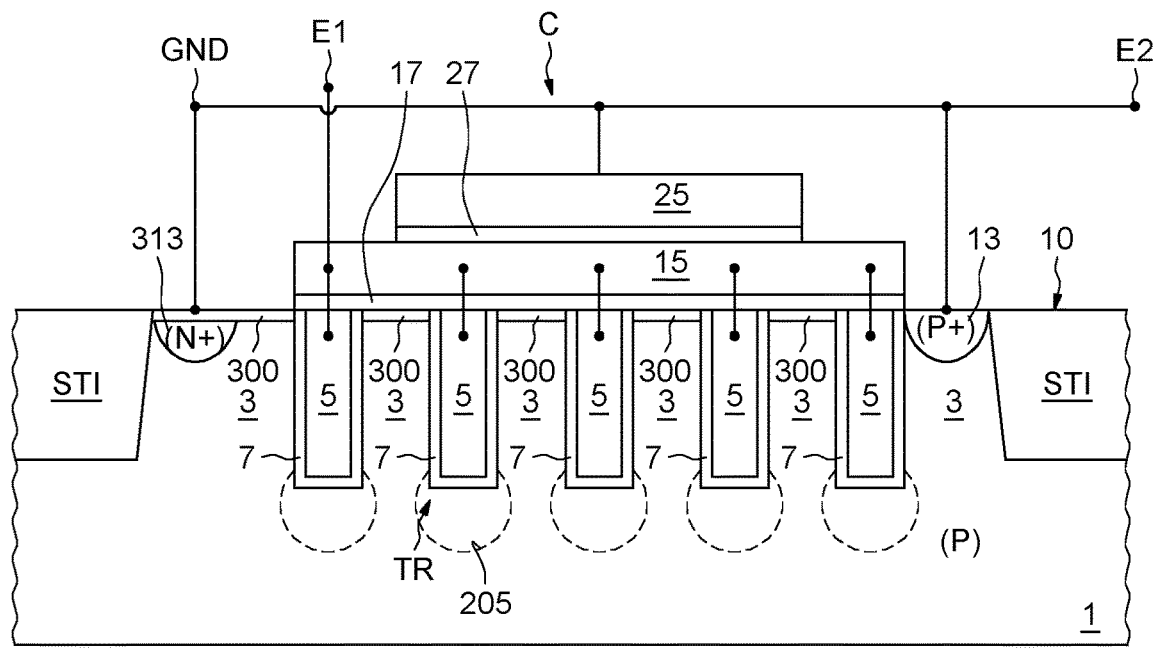

FIG. 6 shows an example of another embodiment of a capacitive element C able to operate in inversion mode, in which figure structural elements in common with the examples described above with reference to FIGS. 1 to 5 have been given the same references and are not described in detail again below.

In this example, the auxiliary semiconductor layer, which is the source of minority carriers, is obtained by forming what is called a counter-implant layer 300, which is located on the surface of the well level with the front side 10, and doped with the second conductivity type.

Likewise, an auxiliary contact region 313 that is highly doped with the second conductivity type allows a contact of acceptable resistivity with the auxiliary semiconductor layer 300, allowing a biasing voltage to be applied thereto.

The same auxiliary contact redistribution 313 is also connected to the second electrode E2 and allows an inversion-mode operation of the capacitive element C, similarly to the inversion-mode operation of the example described above with reference to FIGS. 4 and 5.

Figure 7:
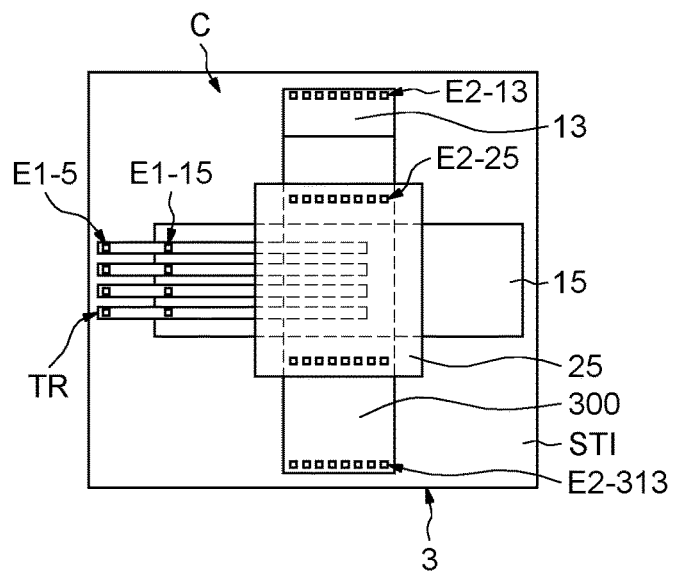

FIG. 7 shows a top view of the example described with reference to FIG. 6; common elements have been given the same references and are not all described in detail again below.

The contacts E1-5 of the central sections 5 and the contacts E1-15 of the first conductive layer 15 are electrically coupled or connected, for example by means of metal tracks (not shown in this figure), thus forming the first electrode (E1) of the capacitive element C.

The contacts E2-13 of the well 3, the contacts E2-213 of the auxiliary contact redistributions 313 and the contacts E2-25 of the second conductive layer 25 are electrically coupled or connected, for example by means of metal tracks (not shown in this figure), thus forming the second electrode (E2) of the capacitive element C.

The example of FIGS. 6 and 7 has the advantage of not being formed in a triple well, requiring an isolating "ring" encircling the well 3 containing the capacitive element C laterally and longitudinally, and therefore of having a correspondingly smaller area.

Figure 8:
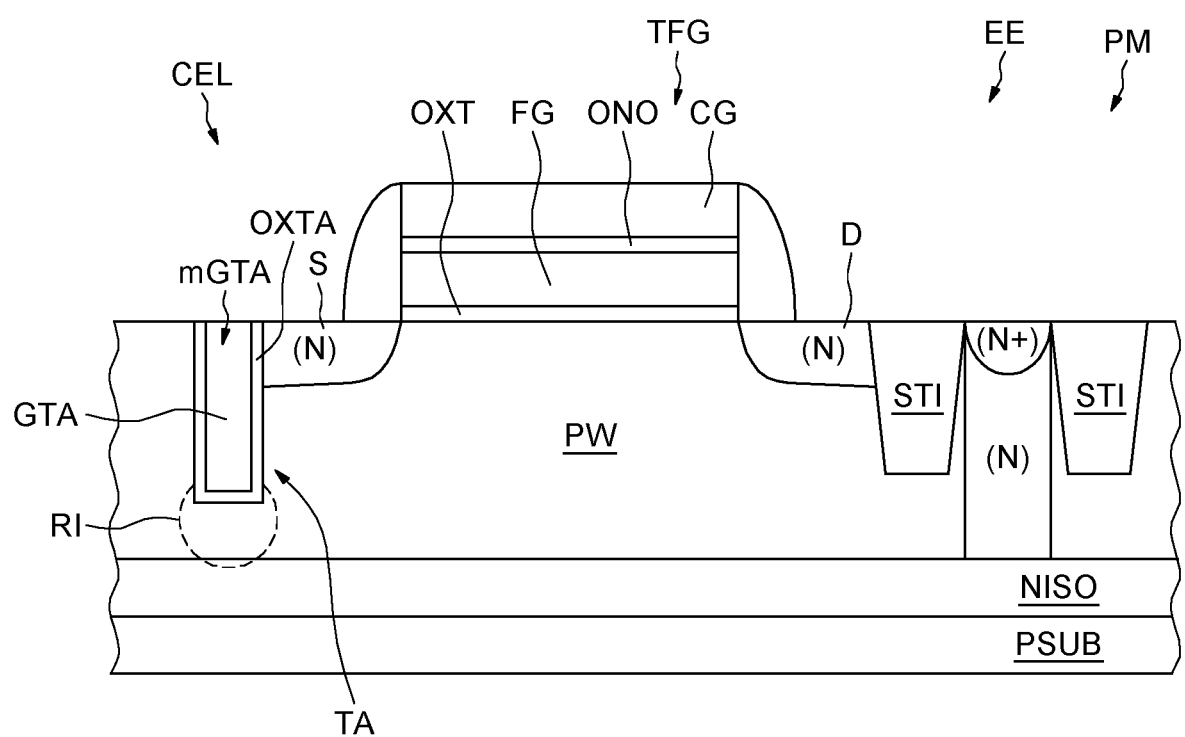
FIG. 8 illustrates a non-volatile memory device.

These various examples of embodiments are in particular compatible with a process for producing a non-volatile memory device EE the memory plane PM of which possesses, as schematically illustrated in FIG. 8, non-volatile memory cells CEL and vertical-gate selection transistors TA.

More precisely, each memory cell CEL includes a floating-gate transistor TFG produced in and on a semiconductor well PW of the first conductivity type, in a triple-well architecture, i.e. the well is separated from the subjacent substrate PSUB of the first conductivity type by a buried semiconductor layer NISO and semiconductor segments NW of the second conductivity type.

As is conventional, each floating-gate transistor TFG includes a source region S and a drain region D that are doped with the second conductivity type, and a floating gate FG and a control gate CG that are for example made of polysilicon and mutually separated by a control-gate dielectric ONO. The floating gate rests on a tunnel-oxide layer OXT formed on the surface of the well PW.

Each access transistor TA allows a row of cells to be selected and is a MOS transistor the gate GTA of which is a gate buried in the p-type well and electrically insulated from this well by a gate dielectric OXTA, typically silicon dioxide. The gate material mGTA of the vertical gate GTA is for example polysilicon.

An implanted region RI of the second conductivity type located between the bottom of the trench accommodating the vertical gate GTA and the buried layer NISO allows, with the buried layer NISO, the source region of the access transistor TA to be formed.

Figure 9:
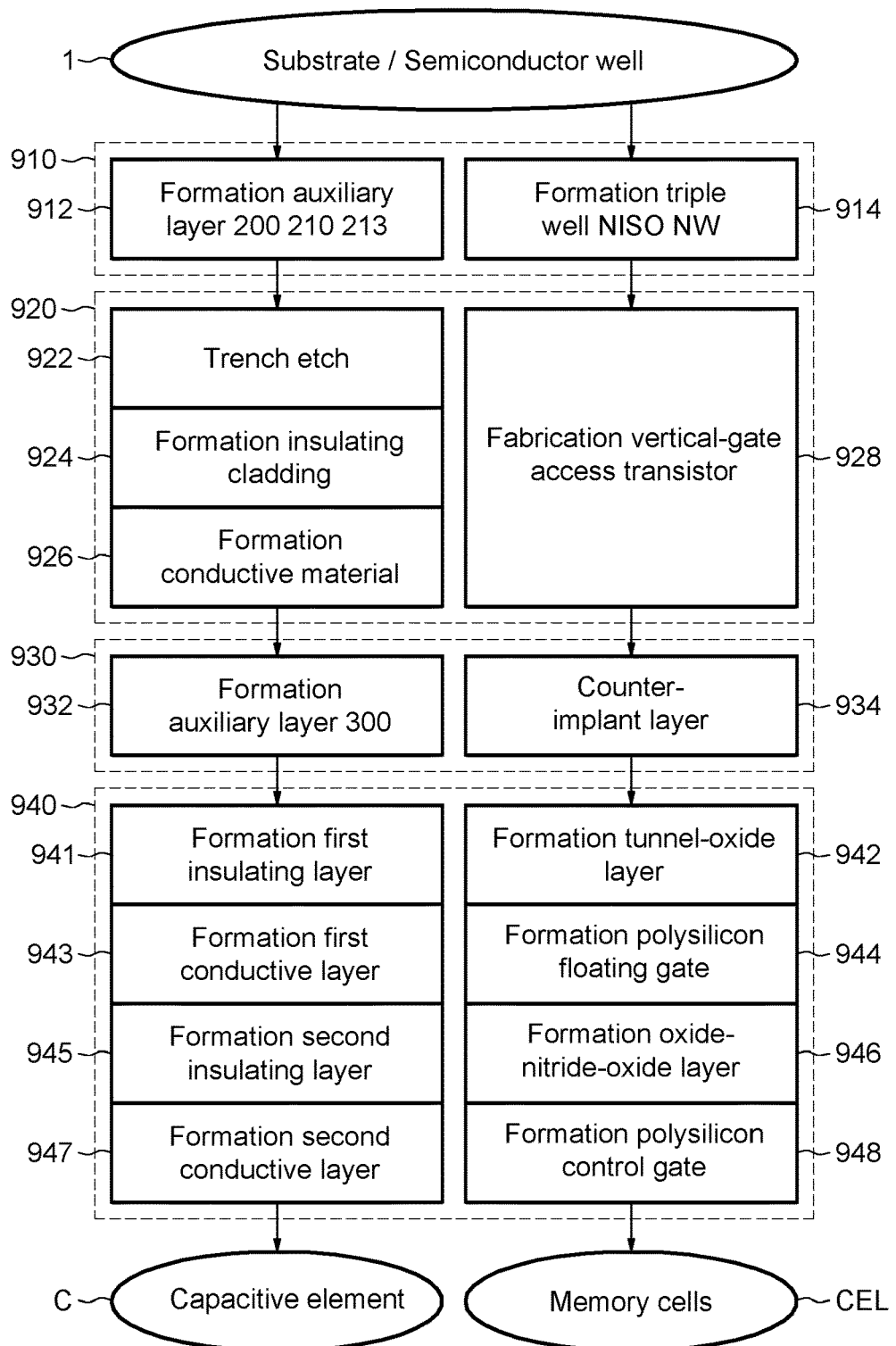
FIG. 9 shows a process for conjointly fabricating, on the same semiconductor substrate, a capacitive element and non-volatile memory cells.

FIG. 9 shows an example of an implementation of a process for conjointly fabricating, on the same semiconductor substrate 1, a capacitive element C according to an example such as described above with reference to FIGS. 1 to 7 and non-volatile memory cells CEL of the same type as those described with reference to FIG. 8.

The step 912 of forming the auxiliary layer 200-210-230 according to the embodiment described above with reference to FIGS. 4 and 5 and the step 914 of forming a triple well PW of the memory EE are implemented in a common step 910.

Specifically, the formation of the triple well PW comprises forming a buried semiconductor layer NISO and semiconductor wells NW of the second conductivity type, and generally highly-doped contact redistributions in the surface of the wells NW, of the same natures as the elements of the auxiliary semiconductor layer 200-210-213.

Likewise, said trenches TR and the vertical-gate access transistors TA are formed in a common step 920.

Specifically, the formation 928 of the vertical gates GTA of the access transistors TA comprises an etch of trenches of the same nature as the etch of the trenches 922 belonging to the capacitive element C, forming a gate dielectric OXTA of the same nature as the step 924 of forming the insulating cladding 7, and a step of filling with a gate material mGTA, of the same nature as the step 926 of forming a conductive material in the central section 5 of said trenches TR.

The step 932 of forming the auxiliary layer 300 according to the embodiment described above with reference to FIGS. 6 and 7, and the step 934 of forming a counter-implant layer in the well of a floating-gate transistor are implemented in a common step 930.

The steps of forming the structure made up of the first insulating layer 17, the first conductive layer 15, the second insulating layer 27 and the second conductive layer 25 are implemented in steps 940 that are common to the formation of floating-gate transistors TFG of the memory EE.

Specifically, the step 941 of forming a first insulating layer 17 is of the same nature as a step 942 of forming a tunnel oxide OXT; the step 943 of forming a first conductive layer 15 is of the same nature as a step 944 of forming a polysilicon floating-gate layer FG; the step 945 of forming the second insulating layer 27 is of the same nature as a step of forming a layer ONO of silicon oxide-nitride-oxide separating the gates of a floating-gate transistor TFG; and the step 947 of forming a second conductive layer 25 is of the same nature as a step 948 of forming a polysilicon control-gate layer CG.

Thus, with conventional fabricating steps, for example the steps required to fabricate a memory cell CL of a memory device EE, a capacitive element C exploiting three types of interface of conductive materials separated by an insulator, and exploiting the substrate (or the well) depthwise to maximize the area of said interfaces without taking up space on the front-side surface, has been produced.

In other words, this example of a capacitive element structure allows its capacitance per unit area (i.e. per unit area occupied on the front side of the well) to be maximized.

By way of example, the capacitance per unit area of such an embodiment may be 15 to 20 $fF/\mu m^2$, whereas conventional capacitive elements have capacitances per unit area of substantially 6 $fF/\mu m^2$.

Moreover, the invention is not limited to these embodiments and implementations but encompasses any variant thereof; for example, the steps of fabricating the capacitive element C may be implemented separately from said conventional steps of fabricating a memory cell, i.e. implemented in a way dedicated to the fabrication of the capacitive element C; likewise, the first and second conductivity types may be, as shown in the figures, p-type and n-type, respectively, or inversely may be n-type and p-type, respectively.

The invention claimed is:

1. An integrated circuit, comprising:
   a semiconductor substrate containing at least one semiconductor well that is doped with a first conductivity type;
   a capacitive element comprising:
     at least one trench extending vertically into said at least one semiconductor well from a first side of the semiconductor substrate, said at least one trench including a conductive central section clad with an insulating cladding;
     a first conductive layer covering a first insulating layer that is located on the first side; and
     a second conductive layer covering a second insulating layer that is located on the first conductive layer;
   wherein the conductive central section and the first conductive layer are electrically coupled to form a first electrode of the capacitive element;
   wherein the second conductive layer and the at least one semiconductor well are electrically coupled to form a second electrode of the capacitive element; and
   wherein the insulating cladding, the first insulating layer and the second insulating layer form a dielectric region of the capacitive element.

2. The integrated circuit according to claim 1, wherein the first insulating layer separates the conductive central section and the insulating cladding from physical contact with the first conductive layer.

3. The integrated circuit according to claim 1, further comprising an auxiliary semiconductor layer in the semiconductor substrate that is configured to form a source of minority carriers in the at least one semiconductor well.

4. The integrated circuit according to claim 3, wherein the auxiliary semiconductor layer is doped with a second conductivity type opposite the first conductivity type and further comprising a coupling of the auxiliary semiconductor layer to receive a biasing voltage.

5. The integrated circuit according to claim 3, wherein the auxiliary semiconductor layer includes a buried layer under the at least one semiconductor well and under said at least one trench, and contact segments extending from the first side to the buried layer.

6. The integrated circuit according to claim 5, wherein the auxiliary semiconductor layer further includes an auxiliary contact region level with the first side and electrically coupled to the second electrode.

7. The integrated circuit according to claim 5, further including an implanted region doped with a second conductivity type opposite the first conductivity type and located between a bottom of the at least one trench and the buried layer.

8. The integrated circuit according to claim 3, wherein the auxiliary semiconductor layer is located level with the first side in the at least one semiconductor well.

9. The integrated circuit according to claim 8, wherein the auxiliary semiconductor layer includes an auxiliary contact region extending from the first side and being electrically coupled to the second electrode.

10. The integrated circuit according to claim 1, further comprising:
a memory device including a memory plane possessing a plurality of non-volatile memory cells, each non-volatile memory cell including an access transistor comprising a vertical gate, and a floating-gate transistor, wherein said at least one trench has a depth substantially equal to a depth of the vertical gate.

11. The integrated circuit according to claim 10, wherein the vertical gate includes a gate material clad with a gate dielectric, wherein a material of said conductive central section is a same material as said gate material and wherein a material of said insulating cladding is a same material as said gate dielectric.

12. The integrated circuit according to claim 10, wherein said floating-gate transistor includes a double-gate structure comprising a tunnel oxide, a conductive floating gate, a control-gate dielectric and a conductive control gate, and wherein the first insulating layer is a same material as and is located at a same level as the tunnel oxide, wherein the first conductive layer is a same material as and is located at a same level as the conductive floating gate, wherein the second insulating layer is a same material as and is located at a same level as the control-gate dielectric and wherein the second conductive layer is a same material as and is located at a same level as the conductive control gate.

13. The integrated circuit according to claim 10, further comprising an auxiliary semiconductor layer located level with the first side of semiconductor substrate, the auxiliary semiconductor layer configured to form a source of minority carriers in the at least one semiconductor well.

14. The integrated circuit according to claim 1, wherein the trench has a width extending parallel to the first side that is between 5 nm and 500 nm.

15. The integrated circuit according to claim 1, wherein the trench has a depth extending perpendicular to the first side that is between 300 nm and 700 nm.

16. The integrated circuit according to claim 1, further comprising an implanted region doped with a second conductivity type opposite the first conductivity type and located in the at least one semiconductor well at a bottom of the at least one trench.

17. An integrated circuit, comprising:
a semiconductor substrate containing a semiconductor well that is doped with a first conductivity type;
a trench extending vertically into said semiconductor well from a first side of the semiconductor substrate;
a conductive central section located within said trench, wherein the conductive central section is insulated from the semiconductor well by an insulating cladding;
a first insulating layer covering a top surface of the conductive central section;
a first conductive layer covering the first insulating layer;
a second insulating layer covering a top surface of the first conductive layer;
a second conductive layer covering the second insulating layer;
a first electrical connection between the first conductive layer and the conductive central section;
a second electrical connection between the second conductive layer and the semiconductor well;
wherein the first conductive layer and the conductive central section form a first electrode of a capacitor; and
wherein the second conductive layer and the semiconductor well form a second electrode of said capacitor.

18. The integrated circuit according to claim 17, further comprising an auxiliary semiconductor layer in the semiconductor substrate that is doped with a second conductivity type opposite the first conductivity type and configured to form a source of minority carriers in the semiconductor well.

19. The integrated circuit according to claim 18, further comprising a contact configured to couple a biasing voltage to the auxiliary semiconductor layer.

20. The integrated circuit according to claim 18, further comprising an electrical connection between the second conductive layer and the auxiliary semiconductor layer.

21. The integrated circuit according to claim 17, further comprising an implanted region doped with a second conductivity type opposite the first conductivity type and located in the semiconductor well at a bottom of the trench.

22. The integrated circuit according to claim 21, further comprising an auxiliary semiconductor layer under the semiconductor well, the auxiliary semiconductor layer doped with the second conductivity type and in contact with the implanted region.

23. The integrated circuit according to claim 17, further comprising:
a memory device including a memory plane possessing a plurality of non-volatile memory cells, each non-volatile memory cell including an access transistor comprising a vertical gate, and a floating-gate transistor, wherein said at least one trench has a depth substantially equal to a depth of the vertical gate.

24. The integrated circuit according to claim 23, wherein the vertical gate includes a gate material clad with a gate dielectric, wherein a material of said conductive central section is a same material as said gate material and wherein a material of said insulating cladding is a same material as said gate dielectric.

25. The integrated circuit according to claim 23, wherein said floating-gate transistor includes a double-gate structure comprising a tunnel oxide, a conductive floating gate, a control-gate dielectric and a conductive control gate, and wherein the first insulating layer is a same material as and is located at a same level as the tunnel oxide, wherein the first conductive layer is a same material as and is located at a same level as the conductive floating gate, wherein the second insulating layer is a same material as and is located at a same level as the control-gate dielectric and wherein the second conductive layer is a same material as and is located at a same level as the conductive control gate.

26. The integrated circuit according to claim 17, wherein the trench has a width extending parallel to the first side that is between 5 nm and 500 nm.

27. The integrated circuit according to claim 17, wherein the trench has a depth extending perpendicular to the first side that is between 300 nm and 700 nm.

* * * * *